United States Patent [19]

Brennan

[11] 4,387,963

[45] Jun. 14, 1983

[54] TEMPERATURE COMPENSATION FOR A LIQUID CRYSTAL DISPLAY VIA CAPACITANCE COMPENSATION OF THE LIQUID CRYSTAL MATERIAL

[75] Inventor: Martin J. Brennan, Blackpool, England

[73] Assignee: Racal Research Limited, Bracknell, England

[21] Appl. No.: 196,917

[22] Filed: Oct. 14, 1980

[30] Foreign Application Priority Data

Nov. 17, 1979 [GB] United Kingdom ................ 7939824

[51] Int. Cl.³ .............................................. G02F 1/13
[52] U.S. Cl. .............................. 350/331 T; 361/274
[58] Field of Search ....................... 350/330, 331 T; 361/274, 282

[56] References Cited

PUBLICATIONS

Hilsum et al., "A Novel Method of Temperature Compensation for Multiplexed Liquid Crystal Displays", *Electronics Letters*, vol. 14, pp. 430-432, Jul. 6, 1978.

*Primary Examiner*—John K. Corbin
*Assistant Examiner*—David Lewis
*Attorney, Agent, or Firm*—Leydig, Voit, Osann, Mayer & Holt, Ltd.

[57] ABSTRACT

A circuit is disclosed producing an output voltage which varies with temperature in a manner matching the manner in which the voltage required to maintain a given light transmission of a liquid crystal display (LCD) segment varies with temperature. The LCD segment is connected across a high input impedance amplifier so as to provide capacitive negative feedback. Ganged electronic switches connect equal value capacitors alternately to the amplifier output and (through an input capacitor) the amplifier input. The switches are driven at the LCD multiplexing frequency. Any charge on one of the two equal value capacitors causes the amplifier to produce a greater charge of opposite sign on the other of them and this develops a voltage across the LCD segment which changes its capacitance until a stable situation is reached in which its capacitance equals that of the input capacitor and the gain of the amplifier is unity. Any change in the LCD capacitance produced by changing temperature causes a change in the voltage across the two equal value capacitors which in turn alters the capacitance of the LCD segment back to the value equal to that of the input capacitor. Consequently the capacitance, and thus the light transmission, of the segment is changed back to the value existing before the temperature change.

3 Claims, 2 Drawing Figures

TEMPERATURE COMPENSATION FOR A LIQUID CRYSTAL DISPLAY VIA CAPACITANCE COMPENSATION OF THE LIQUID CRYSTAL MATERIAL

BACKGROUND OF THE INVENTION

The invention relates to temperature-responsive electrical circuit arrangements.

BRIEF SUMMARY OF THE INVENTION

More specifically, though not exclusively, the invention relates to electrical circuit arrangements for compensating liquid crystal displays (LCDs) for the effects of change in temperature, The light transmission through an LCD varies with voltage and an LCD is switched from a very low level of light transmission to a high (e.g. 100%) level of light transmission by changing the applied voltage from one value to another. However, the level of light transmission produced in an LCD by a given value of voltage varies considerably with temperature and this can cause significant problems when LCDs are arranged to be driven by multiplex addressing (which is usually highly desirable in order to reduce the number of interconnections to a practical level). If no temperature compensation is provided, then a multiplex-driven LCD system which operates by switching the LCDs between two fixed values of voltage intended to correspond respectively with dark and light states of the LCDs will function satisfactorily at one temperature but may be unsatisfactory when the temperature changes—even by as little as plus or minus 20° C.

In a broad sense, there will be described below an electrical circuit arrangement responsive to a transducer whose capacitance varies with a predetermined ambient parameter and also with applied voltage, comprising means responsive to changes in capacitance caused by variations in the said parameter to produce a change in voltage across the transducer in a sense and by an amount so as to produce a substantially equal and opposite change in its capacitance whereby the said voltage is a measure of the parameter.

In a more specific sense, there will be disclosed below an electrical circuit arrangement for producing an output voltage which varies with temperature in a manner matching the manner in which the voltage required to maintain a given light transmission of a liquid crystal display (LCD) segment varies with temperature, comprising a high input impedance amplifier across which the LCD segment is connected so as to provide capacitance negative feedback, first and second equal-capacitance output capacitors both connected to ground, first and second switch means connected so as to be switchable between a first setting in which it connects the first output capacitor to the amplifier output and a second setting in which it connects the second output capacitor to the amplifier output and the other connected so as to be switchable between a first setting in which it connects the first output capacitor to the amplifier input through an input capacitor having a predetermined value and a second setting in which it connects the second output capacitor to the amplifier input through the said input capacitor, and switch drive means for repeatedly switching the switches in unison between their two settings so that the first switch means is in its first setting when the second switch means is in its second setting and vice versa, so that any change in temperature of the LCD segment produces such change in its capacitance as causes a resultant change in the voltage across the output capacitors which in turn alters the capacitance of the LCD segment back to a value equal to that of the input capacitor in which condition the gain of the amplifier and the LCD segment is unity, and alters the light transmission of the segment back to the value obtaining before the temperature change.

DESCRIPTION OF THE DRAWINGS

A temperature-compensating electrical circuit arrangement for a liquid crystal display arrangement and embodying the invention will now be described, by way of example, with reference to the accompanying drawing in which.

DESCRIPTION OF PREFERRED EMBODIMENTS

The circuit arrangement to be described operates by sensing the capacitance of the liquid crystal display, or part of it, and producing a voltage which maintains this capacitance at the same value. The capacitance of an LCD, across which at least a predetermined threshold voltage is applied, changes with temperature in the same manner as does light transmission of the LCD. In this way, therefore, the circuit arrangement produces an output voltage which varies with the change in temperature of the LCD in a manner which matches the voltage necessary to produce the given level of light transmission at any temperature.

Figure 1:
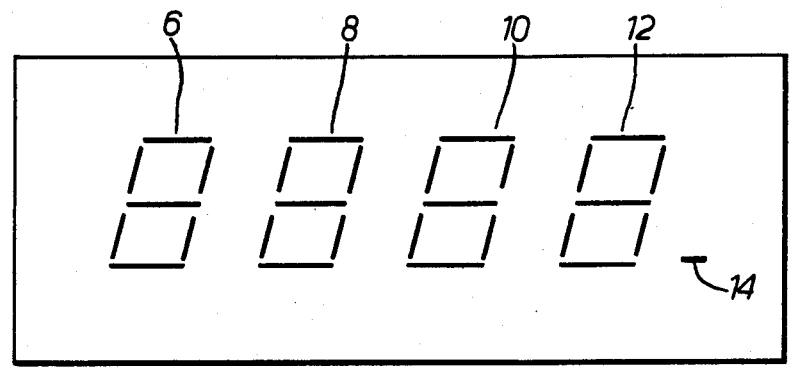
FIG. 1 shows the display arrangement diagrammatically.

FIG. 1 shows diagrammatically the display arrangement comprising (in this example) four seven-segment LCD sections 6, 8, 10 and 12, and a further liquid crystal segment 14. In a manner to be explained, the changes in capacitance of the segment 14 are measured to produce corresponding voltage changes, and the segment 14 thus acts as a temperature sensor.

Figure 2:
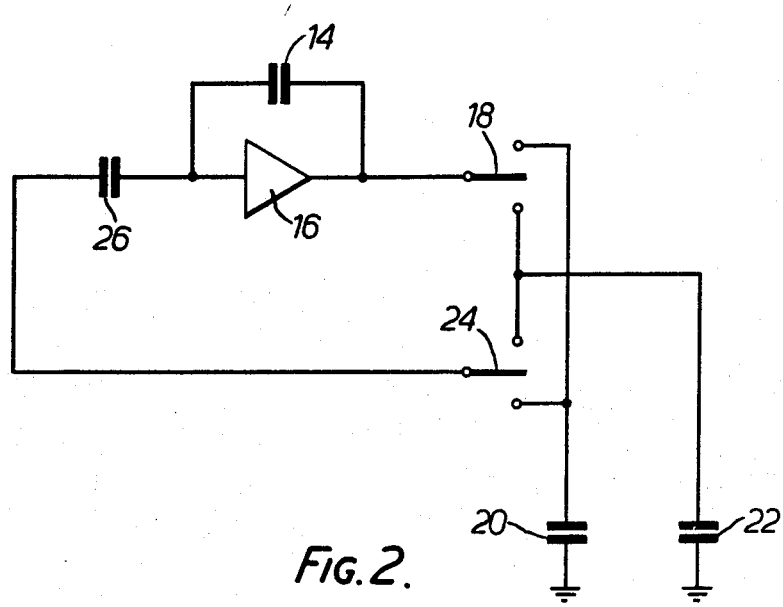
FIG. 2 is a circuit diagram of the circuit arrangement.

FIG. 2 shows the circuit arrangement.

In FIG. 2, the segment 14 (FIG. 1), which has a capacitance $C_{lcd}$ (varying with temperature in the manner referred to above), is connected across an inverting amplifier 16 having a high input impedance (e.g. having an FET input). The amplifier output is connected to a two-way switch 18 by means of which its output can be applied across either a capacitor 20 or a capacitor 22, each of these capacitors having the same capacitance, $C_r$. A second switch, 24, ganged for operation with switch 18, connects either the capacitor 20 or the capacitor 22 back to the input of the amplifier 16 through a further capacitor 26 having a capacitance C.

The switches 18 and 24 are electronic switches, e.g. CMOS analogue switches. By means of an oscillator circuit not shown, they are switched between their two states at the multiplexing frequency for the display.

Capacitor 26 is a low leakage capacitor and its capacitance, C, is chosen to have a value equal to the capacitance of the liquid crystal segments at a threshold level of light transmission (e.g. 90% transmission). For a small LCD segment, C may have a value between 30 pf and 1500 pf.

The capacitance $C_r$ of the capacitors 20 and 22 should be relatively large, e.g. between 33 nF and 1 uF.

When the circuit arrangement is switched on, any small positive charge on one of the capacitors 20, 22 (on capacitor 22, for example) will be fed to the input of amplifier 16 when that capacitor, capacitor 22, is connected to capacitor 26 by switch 20. The amplifier 16 will therefore produce an amplified, negative, output which will charge the other capacitor, capacitor 20, to a larger, negative, level. When the switches 18 and 24 change over, the larger negative charge on capacitor 20 will now be applied to the amplifier input 16 through capacitor 26, and the amplifier output, now positive, will increase the positive charge on capacitor 22.

This process will continue but will increase the voltage applied across the LCD segment 14. The capacitance $C_{lcd}$ varies monotonically with voltage, and increasing the voltage across the segment 14 has the effect of increasing the capacitance $C_{lcd}$. Because the gain of the amplifier (ideally) is given by $C/C_{lcd}$, the amplifier gain will therefore reduce.

In this way, the circuit arrangement will stabilise when the voltage on each of these capacitors 20 and 22 is such that $C_{lcd}=C$ and the amplifier has unity gain. At this time, the capacitors 20 and 22 will of course be storing charges of opposite polarity and each equal to the voltage at which $C_{lcd}=C$. As capacitance C has been chosen to be the capacitance of the LCD segments at 90% transmission, then the voltage across each of the capacitors 20 and 22 will be the threshold voltage corresponding to this level of light transmission at the current temperature of the display arrangement. This output voltage can therefore be used as a threshold voltage in the multiplexing arrangement for driving the LCD segments and will therefore enable them to be switched between predetermined levels of light transmission in a manner unaffected by changes in their temperature.

What is claimed is:

1. An electrical circuit arrangement responsive to a transducer whose capacitance varies with a particular ambient parameter and also with applied voltage, comprising
   a high input impedance amplifier,
   means connecting the transducer to produce negative feedback across the amplifier,
   two output capacitors,
   an input capacitor having a predetermined capacitance and connected to the input of the amplifier, and
   switch means arranged to connect each of the output capacitors alternately to the output of the amplifier and to connect the other of them to the input of the amplifier through the input capacitor,
   whereby the circuit arrangement is stable when the charge on each of the output capacitors is such that the voltage across the transducer controls it to have a capacitance equal to that of the input capacitor so that the gain of the amplifier and the transducer is unity, and any changes in the capacitance of the transducer caused by variations in the said parameter produce a change in voltage across the transducer in a sense and by an amount so as to produce a substantially equal and opposite change in its capacitance whereby the said voltage is a measure of the parameter.

2. An electrical circuit arrangement for producing an output voltage which varies with temperature in a manner matching the manner in which the voltage required to maintain a given light transmission of a liquid crystal display (LCD) segment varies with temperature, comprising
   a high input impedance amplifier across which the LCD segment is connected so as to provide capacitance negative feedback,
   first and second equal-capacitance output capacitors both connected to ground,
   an input capacitor having a predetermined capacitance and connected to the input of the amplifier,
   first and second switch means, one connected so as to be switchable between a first setting in which it connects the first output capacitor to the amplifier output and a second setting in which it connects the second output capacitor to the amplifier output and the other connected so as to be switchable between a first setting in which it connects the first output capacitor to the amplifier input through the input capacitor and a second setting in which it connects the second output capacitor to the amplifier input through the said input capacitor, and
   switch drive means for repeatedly switching the switches in unison between their two settings so that the first switch means is in its first setting when the second switch means is in its second setting, and vice versa,
   whereby any change in temperature of the LCD segment produces such change in its capacitance as causes a resultant change in the voltage across the output capacitors which in turn alters the capacitance of the LCD segment back to a value equal to that of the input capacitor, in which condition the gain of the amplifier and the LCD segment is unity, and alters the light transmission of the segment back to the vaLue obtaining before the temperature change.

3. An arrangement according to claim 2, in which the LCD segment is part only of a liquid crystal display arrangement, whereby the output voltage across the output capacitors is a control voltage for controlling the energisation of the remainder of the display arrangement in a manner compensated for the effects of temperature changes.

* * * * *